(12) United States Patent
Kong

(10) Patent No.: US 9,564,556 B2
(45) Date of Patent: Feb. 7, 2017

(54) LIGHT EMITTING DEVICE AND METHOD FOR FABRICATING THE SAME

(71) Applicant: LG INNOTEK CO., LTD., Seoul (KR)

(72) Inventor: Sung Min Kong, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 28 days.

(21) Appl. No.: 13/937,899

(22) Filed: Jul. 9, 2013

(65) Prior Publication Data

US 2013/0334554 A1 Dec. 19, 2013

Related U.S. Application Data

(63) Continuation of application No. 11/746,783, filed on May 10, 2007, now Pat. No. 8,680,545.

(30) Foreign Application Priority Data

May 11, 2006 (KR) .................. 10-2006-0042199

(51) Int. Cl.
*H01L 33/60* (2010.01)
*H01L 33/48* (2010.01)
*F21V 8/00* (2006.01)

(52) U.S. Cl.
CPC ........... *H01L 33/483* (2013.01); *G02B 6/0031* (2013.01); *G02B 6/0073* (2013.01); *H01L 33/60* (2013.01); *H01L 33/486* (2013.01); *H01L 2224/48091* (2013.01); *H01L 2224/48247* (2013.01); *H01L 2224/49107* (2013.01)

(58) Field of Classification Search
None
See application file for complete search history.

(56) References Cited

U.S. PATENT DOCUMENTS

| | | | |
|---|---|---|---|
| 6,274,890 B1 | 8/2001 | Oshio et al. |
| 6,495,861 B1 | 12/2002 | Ishinaga |
| 6,547,416 B2 | 4/2003 | Pashley et al. |
| 7,520,647 B2 | 4/2009 | Tachibana |
| 7,569,987 B2 | 8/2009 | Naitou |

(Continued)

FOREIGN PATENT DOCUMENTS

| | | |
|---|---|---|
| JP | 1-168079 A | 7/1989 |
| JP | 2000-269551 A | 9/2000 |

(Continued)

OTHER PUBLICATIONS

Notice of Allowance dated Mar. 5, 2013 in Japanese Application No. 2012-039857, filed Feb. 27, 2012.

(Continued)

*Primary Examiner* — Benjamin Sandvik
(74) *Attorney, Agent, or Firm* — Ked & Associates, LLP

(57) ABSTRACT

Embodiments of a light emitting device and a method for fabricating the same are provided. The light emitting device comprises a cavity and one or more light emitting elements. The cavity is formed to a depth of 450 μm or less, and the light emitting elements are installed in the cavity. A fabricating method includes forming a package body having a cavity with a depth of 250 μm to 450 μm and at least one lead frame disposed at the bottom surface of the cavity, mounting at least one light emitting element on the lead frame, and molding a molding member in the cavity.

22 Claims, 7 Drawing Sheets

(56) References Cited

U.S. PATENT DOCUMENTS

| | | | |
|---|---|---|---|
| 7,656,083 B2 | 2/2010 | Sumitani | |
| 7,850,344 B2 | 12/2010 | Shiraishi et al. | |
| 8,030,674 B2 | 10/2011 | Hsu et al. | |
| 8,348,445 B2* | 1/2013 | Nakanishi | G02F 1/133605 |
| | | | 362/632 |
| 8,680,545 B2 | 3/2014 | Kong | |
| 2002/0030996 A1 | 3/2002 | Sakakibara | |
| 2003/0008431 A1 | 1/2003 | Matsubara et al. | |
| 2004/0046242 A1 | 3/2004 | Asakawa | |
| 2004/0256706 A1 | 12/2004 | Nakashima | |
| 2005/0121688 A1* | 6/2005 | Nagai et al. | 257/99 |
| 2005/0127816 A1 | 6/2005 | Sumitani | |
| 2005/0133805 A1 | 6/2005 | Yoshimatsu et al. | |
| 2005/0133808 A1 | 6/2005 | Uraya et al. | |
| 2005/0205974 A1* | 9/2005 | Su | H01L 33/486 |
| | | | 257/678 |
| 2005/0242362 A1 | 11/2005 | Shimizu et al. | |
| 2005/0286264 A1 | 12/2005 | Kim et al. | |
| 2006/0011936 A1 | 1/2006 | Hiramatsu et al. | |
| 2006/0023451 A1* | 2/2006 | Han et al. | 362/249 |
| 2006/0027826 A1 | 2/2006 | Goodrich | |
| 2006/0226435 A1 | 10/2006 | Mok et al. | |
| 2006/0267040 A1* | 11/2006 | Baek et al. | 257/99 |
| 2007/0090379 A1* | 4/2007 | Goon et al. | 257/98 |
| 2007/0114514 A1* | 5/2007 | Ito | H01L 33/60 |
| | | | 257/13 |
| 2007/0120234 A1* | 5/2007 | Kim et al. | 257/666 |
| 2008/0173883 A1* | 7/2008 | Hussell | G02B 6/0073 |
| | | | 257/98 |

FOREIGN PATENT DOCUMENTS

| | | |
|---|---|---|
| JP | 2001-184924 A | 7/2001 |
| JP | 2002-009349 A | 1/2002 |
| JP | 2002-033520 A | 1/2002 |
| JP | 2002-217459 A | 8/2002 |
| JP | 2003-234008 A | 8/2003 |
| JP | 2003-347600 A | 12/2003 |
| JP | 2004-281856 A | 10/2004 |
| JP | 2004-327503 A | 11/2004 |
| JP | 2004-327504 A | 11/2004 |
| JP | 2005-078937 A | 3/2005 |
| JP | 2005-136349 A | 5/2005 |
| JP | 2005-159090 A | 6/2005 |
| JP | 2005-203748 A | 7/2005 |
| JP | 2005-209763 A | 8/2005 |
| JP | 2005-285874 A | 10/2005 |
| JP | 2005-353699 A | 12/2005 |
| JP | 2006-073656 A | 3/2006 |
| JP | 2006-100575 A | 4/2006 |
| JP | 2006-351773 A | 12/2006 |
| JP | 2007-150315 A | 6/2007 |
| JP | 2014-160883 | 9/2014 |
| KR | 10-2004-0087566 A | 5/2005 |
| KR | 10-2004-0010079 A | 8/2005 |
| KR | 10-2005-0081716 A | 8/2005 |

OTHER PUBLICATIONS

Office Action dated Apr. 17, 2012 in Japanese Application No. 2007-126415, filed May 11, 2007.
Office Action dated Aug. 21, 2012 in Japanese Application No. 2007-126415, filed May 11, 2007.
Office Action dated Aug. 21, 2012 in Japanese Application No. 2012-039857, filed Feb. 27, 2012.
Office Action dated Aug. 7, 2012 in Japanese Application No. 2012-039856, filed Feb. 27, 2012.
Office Action dated May 1, 2012 in Japanese Application No. 2012-039856.
Office Action dated May 1, 2012 in Japanese Application No. 2012-039857.
Office Action dated May 15, 2012 in Japanese Application No. 2012-001044.
English machine translation for JP-2005-136349-A, published May 26, 2005.
English machine translation of JP-2006-351773-A, published Dec. 28, 2006.
Japanese Office Action dated Nov. 29, 2016 issued in Application No. 2016-094429.

* cited by examiner

| No | Type 1 | Type 2 | Type 3 | Type 4 |
|---|---|---|---|---|
| SHAPE | | | | |
| LUMINANCE DISTRIBUTION | | | | |
| TOTAL FLUX | 0.154 | 0.141 | 0.207 | 0.182 |
| INCIDENT FLUX OF LGP | 0.124 | 0.102 | 0.170 | 0.158 |

------- ORIENTATION ANGLE OF MINOR AXIS

———— ORIENTATION ANGLE OF MAJOR AXIS

FIG. 5

| No | Type 11 | Type 12 | Type 13 |
|---|---|---|---|
| SHAPE | θ7 | θ8 | θ9 |
| WIDTH OF BOTTOM SURFACE | 350 | 310 | 380 |
| INSIDE ANGLE | 25 | 28.5 | 20.6 |
| TOTAL FLUX | 0.223 | 0.211 | 0.199 |
| INCIDENT FLUX OF LGP | 0.169 | 0.160 | 0.147 |

| No | Type 14 | Type 15 | Type 16 |
|---|---|---|---|
| SHAPE | θ7 | θ8 | θ9 |
| WIDTH OF BOTTOM SURFACE | 350 | 310 | 380 |
| INSIDE ANGLE | 25 | 28.5 | 20.6 |
| TOTAL FLUX | 0.212 | 0.188 | 0.212 |
| INCIDENT FLUX OF LGP | 0.166 | 0.149 | 0.166 |

FIG. 6

LIGHT EMITTING DEVICE AND METHOD FOR FABRICATING THE SAME

CROSS-REFERENCE TO RELATED PATENT APPLICATION

This application is a Continuation of copending application Ser. No. 11/746,783 filed on May 10, 2007, which claims priority to Application No. 10-2006-0042199 filed in the Republic of Korea on May 11, 2006. The entire contents of all of the above applications is hereby incorporated by reference.

BACKGROUND

Field of the Invention

Embodiments of the present invention relate to a light emitting device and a method for fabricating the same.

Description of the Related Art

Light emitting diodes (LEDs) can implement various colors using a light emitting source. The light emitting source is typically formed of compound semiconductors, e.g., GaAS-based materials, AlGaAs-based materials, GaN-based materials, InGaN-based materials, and InGaAlP-based materials.

An LED package includes an LED chip and is used as a light emitting device.

Light emitted from the LED chip mounted in the LED package is lost by light absorption and light scattering within the LED package. Consequently, the light intensity of the LED package is lower than that of an LED chip, leading to degradation in the luminous efficiency of the light emitting device.

BRIEF SUMMARY

An embodiment provides a light emitting device, which can maximize its luminous efficiency, and a method for fabricating the same.

An embodiment provides a light emitting device, which can minimize a depth of a cavity where the light emitting device is mounted, and a method for fabricating the same.

An embodiment provides a light emitting device, in which sidewalls of a cavity are inclined stepwise, and a method for fabricating the same.

An embodiment provides a light emitting device comprising: a cavity having a depth of 450 μm or less; and a light emitting element in the cavity.

An embodiment provides a light emitting device comprising: a package body including a cavity having a depth of 250 μm to 450 μm and a light emitting element in the cavity; a substrate mounted with the package body; and a light guide panel disposed at one side of the package body.

An embodiment provides a method for fabricating a light emitting device, comprising: forming a package body including a cavity with a depth of 250 μm to 450 μm and a lead frame disposed at the bottom surface of the cavity; mounting a light emitting element on the lead frame; and molding a molding member in the cavity.

It is to be understood that both the foregoing general description and the following detailed description of the embodiments are exemplary and explanatory and are intended to provide further explanation of the invention as claimed.

BRIEF DESCRIPTION OF THE DRAWINGS

FIG. 5 is a table showing a comparison result of flux with respect to a depth of a cavity and a shape of a molding member in a light emitting device according to the first embodiment;

FIG. 6 is a table showing a comparison result of flux with respect to an area of a bottom surface of a cavity, an inside angle, and a shape of a molding member in a light emitting device according to the first embodiment;

FIG. 11(a) is a cross-sectional view of a package body, FIG. 11(b) is a front view of the package body, and FIG. 11(c) is a bottom view of the package body.

DETAILED DESCRIPTION

Reference will now be made in detail to the preferred embodiments, examples of which are illustrated in the accompanying drawings. Wherever possible, the same reference numbers will be used throughout the drawings to refer to the same or like parts.

Figure 1:
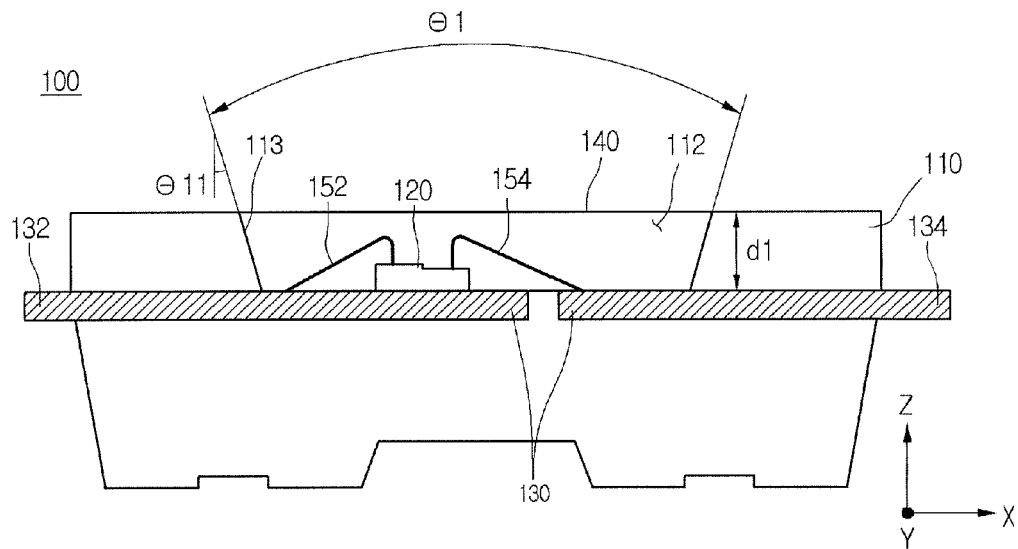
FIG. 1 is a cross-sectional view of a light emitting device according to a first embodiment.
Figure 2:
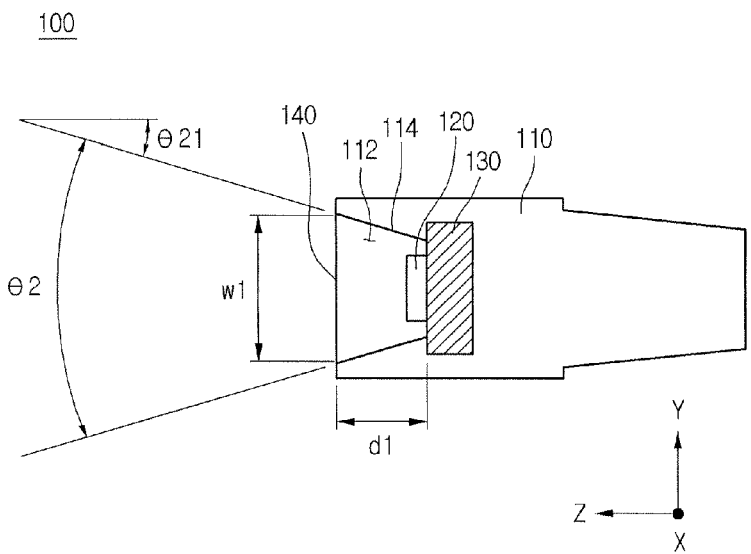
FIG. 2 is a longitudinal cross-sectional view of a light emitting device according to the first embodiment.

FIG. 1 is a cross-sectional view of a light emitting device according to a first embodiment, and FIG. 2 is a longitudinal cross-sectional view of the light emitting device illustrated in FIG. 1.

Referring to FIGS. 1 and 2, a light emitting device 100 can be implemented with a side emission type package or a top emission type package. The light emitting device 100 can be applied to various fields, e.g., a light unit of a display device, an illuminating device, etc. For convenience, the side emission type LED package will be described below for illustrative purposes.

The light emitting device 100 can include a package body 110 with a cavity 112, a light emitting element 120, and a lead frame 130.

The package body 110 may be formed of a resin material. As one example, the package body 110 may be injection molded using a resin material such as PPA in a press molding (Cu/Ni/Ag or Cu/Ag substrate). As another example, the package body 110 may be formed in such a way that a top substrate with a cavity is stacked on a lower substrate with a lead frame 130.

When the light emitting device 100 is implemented with a side emission type LED package, the transverse direction of the package body 110 is a major axis of a length direction X of the package body 110, and the longitudinal direction of the package body 110 is a minor axis of a thickness direction Y of the package body 110.

A cavity 112 can be formed in one side of the package body 110, and a lead frame 130 can be formed under the cavity 112. The lead frame 130 can be inserted in the length direction X of the package body 110.

The lead frame 130 can be provided in plurality and electrically open to each other. Lead electrodes 132 and 134 of each lead frame 130 can be disposed out of the package body 110. At this point, a bottom surface of the cavity 112 may be an upper surface of the lead frame 130.

The cavity 112 of the package body 110 is formed to a predetermined depth or less. A depth "d1" of the cavity 112 is a distance between the top of the cavity 112 and the top of the lead frame 130. The depth "d1" of the cavity 112 may range from approximately 250 µm to approximately 450 µm.

At least one of sidewalls 113 and 114 of the cavity 112 may be inclined. Although all sidewalls of the cavity 112 are illustrated as inclined in FIGS. 1 and 2, this embodiment is not limited to this configuration.

The sidewalls of the cavity 112 can be inclined at a predetermined angle with respect to a Z-axis perpendicular to the bottom surface of the cavity 112. The Z-axis is an axis perpendicular to the bottom surface of the cavity 112 or the top surface of the lead frame 130.

As illustrated in FIG. 1, a first inside angle θ1 formed by the first sidewalls 113 disposed in the length direction of the cavity 112 can be 20-80°, and an angle θ11 of the first sidewalls 113 of the cavity 112 can be inclined outward at 10-40° with respect to the Z-axis. As illustrated in FIG. 2, a second inside angle θ2 formed by the second sidewalls 114 disposed in the thickness direction of the cavity 112 can be 20-40°, and an angle θ21 of the second sidewalls 114 of the cavity 112 can be inclined outward at 10-20° with respect to the Z-axis.

The first and second inside angles θ1 and θ2 may be equal to or different from each other. In addition, the inclined angles θ11 and θ21 of the first and second sidewalls 113 and 114 may be equal to or different from each other.

Due to the inclined sidewalls 113 and 114 of the cavity 112, the upper diameter of the cavity 112 is greater than the lower diameter of the cavity 112. A reflective material (such as, Ag, Al, etc.) may be coated on the sidewalls 113 and 114 of the cavity 112, or a reflective plate may be attached to the sidewalls 113 and 114 of the cavity 112. The cavity 112 may have, but is not limited to, a polygonal outer shape.

At least one semiconductor device may be mounted in the cavity 112. The semiconductor device may include at least one of a light emitting element 120, a light receiving element, and a protection element.

The light emitting element 120 may include at least one LED chip formed of compound semiconductors, for example, GaAS-based materials, AlGaAs-based materials, GaN-based materials, InGaN-based materials, and InGaAlP-based materials. Examples of the LED chip may include a blue LED chip, an ultraviolet LED chip, a red LED chip, a green LED chip, and a yellow-green LED chip. In addition, examples of the LED chip may include a chip having a PN junction structure, a chip having an NPN junction structure, and a chip having two electrodes arranged horizontally or vertically.

The light emitting element 120 can be attached to the top surface of at least one lead frame 130 by a non-conductive adhesive. The light emitting element 120 can be connected to the lead frame 130 using wires 152 and 154 or flip chip technique.

The cavity 112 can be filled with a molding member 140. The molding member 140 can be a transparent resin. A phosphor may be added to the transparent resin. The molding member 140 can be formed of resin materials, for example, a one-liquid-type epoxy, a two-liquid-type epoxy, a hard-type silicone, a soft-type silicone, etc. The molding member 140 can be selected according to use purpose of molding solution or additives, use environments, and characteristics of products.

The surface of the molding member 140 may have a flat shape, a concave lens shape, or a convex lens shape. A convex lens may be further attached to the molding member 140.

In the light emitting device 100, the depth "d1" of the cavity 112 can be formed to be less than 450 µm, while the width of the bottom and top surfaces (the light emitting window region "w1") of the cavity 112 can be maintained equal to that of the related art. Hence, the inclined angle of the sidewalls of the cavity 112 increases.

Therefore, the light emitting device 100 may improve the luminous efficiency more than about 20% compared with the related art. When the light emitting device 100 is used as a light unit, the brightness characteristic can be improved by more than about 30% compared with the related art. The light intensity and luminous flux of the lateral emission type LED package can be increased by increasing the inclined angle of the sidewalls while minimizing the depth of the cavity 112.

Figure 3:
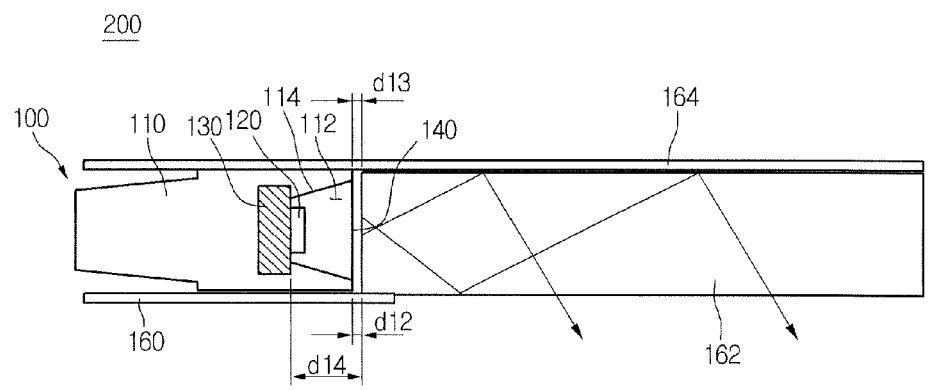
FIG. 3 is a cross-sectional view of a backlight unit having a light emitting device according to the first embodiment.

FIG. 3 is a cross-sectional view of a backlight unit 200 using the light emitting device 100 illustrated in FIG. 2.

Referring to FIG. 3, the light unit 200 can include a light emitting device 100, a substrate 160, a light guide panel (LGP) 162, and a reflector 164.

At least one light emitting device 100 can be mounted on the substrate 160. The LGP 162 can be arranged in a light emitting direction of the light emitting device 100 and guides incident light to form surface light.

The reflector 164 can be disposed under the LGP 162 to reflect leakage light. At least one optical sheet (not shown) may be disposed on the LGP 162. Examples of optical sheets may include a diffusion sheet, a prism sheet, and so on. The substrate 160 may be implemented with a flexible printed circuit board (FPCB), and the reflector 164 may be implemented with a reflection sheet.

Due to an assembly error, a gap of about 200 µm may occur in a distance "d12" between the light emitting device 100 and the LGP 162. If the surface of the molding member 140 has a flat shape, a distance "d13" between the surface of the molding member 140 and the LGP 162 becomes "d12".

If the surface of the molding member 140 has a concave lens shape, a distance between the surface of the molding member 140 and the LGP 162 may become about 300 µm. In this case, a maximum distance between the top surface of the cavity 112 and the surface of the molding member 140 (the height of the concave lens shape) becomes about 100 µm.

When the maximum depth of the cavity 112 is 450 µm, a distance "d14" between the bottom surface of the cavity 112 and the LGP 162 may be about 650 µm (=200 µm+450 µm). Therefore, the distance between the light emitting device 120 and the LGP 162 can be reduced by up to 30% compared with the related art.

In this way, light emitted from the light emitting element 120 of the light emitting device 100 passes through the molding member 140 or is reflected by the sidewalls 114 of the cavity 112 and then is emitted from the package body 110. The light emitted from the package body 110 is incident onto the LGP 162 and is emitted as a surface light from the LGP 162.

At this point, light loss sections can be reduced by minimizing the distance between the light emitting device 120 and the top surface of the cavity 112 and the distance d12 between the top surface of the cavity 112 and the light incident surface of the LGP 162, thereby maximizing the light extraction effect. In addition, it is possible to prevent the reduction of the optical efficiency due to the assembly of the LGP 162 and the light emitting device 100. Furthermore, the guide loss in the LGP 162 can be reduced, improving the brightness intensity.

The luminous flux emitted from the light emitting device 100 may be changed depending on parameters, such as the distance between the light emitting element 120 and the LGP 162, the shape of the surface of the molding member 140, and the inside angle of the cavity 112.

The light emitting device can be used as a backlight source of an LCD in a portable terminal, a surface light source of an illuminating device, and so on. In a surface light source, the light loss section in the light emitting device can be minimized and the light extraction efficiency can be maximized. Moreover, the brightness intensity can be increased.

Figure 4:
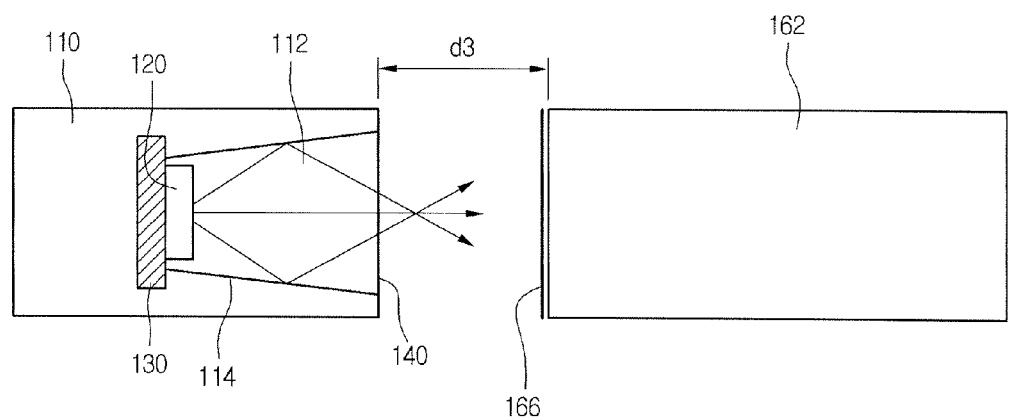
FIG. 4 is a cross-sectional view illustrating an embodiment for a flux measurement of a light emitting device according to the first embodiment.

FIG. 4 is a cross-sectional view illustrating an embodiment for the measurement of light distribution and flux in the light emitting device according to the first embodiment.

Referring to FIG. 4, light emitted from the light emitting element 120 is incident onto a light receiving element 166 and the LGP 162 disposed in front of the light emitting device 100. The light receiving element 166 measures the flux incident onto the LGP 162 and has an area of 5 mm×0.6 mm.

FIG. 5 is a table showing a comparison result of light distribution and flux received in the light receiving element 166 with respect to a depth of a cavity and a surface shape of a molding member 140 in a light emitting device according to the first embodiment. This simulation used a chip having the package body formed of PPA resin (reflectance=90%), the molding member formed of silicone resin (refractive index=1.42), the light emitting element having a volume of 250 μm×480 μm×80 μm, the peak wavelength of 455 nm, and the full width at half maximum (FWHM) of 22 nm.

Luminance distribution is measured using a luminance distribution (shown as a solid line) of a major-axis direction (or a length direction) and a luminance distribution (shown as a dotted line) of a minor-axis direction (or a thickness direction) of the light emitting device. The total flux is the flux emitted from the light emitting device. The incident flux of the LGP is the flux actually received by the light emitting element (166 in FIG. 4) or the flux incident onto the LGP.

Referring to FIG. 5, for a first package type TYPE 1, the depth of the cavity is 600 μm and the surface of the molding member has a flat shape. In the luminance distribution of the first package type TYPE 1, the total flux is 0.154 lm and the incident flux of the LGP is 0.124 lm.

For a second package type TYPE 2, the depth of the cavity is 600 μm and the surface of the molding member has a concave lens shape. In the luminance distribution of the second package type TYPE 2, the total flux is 0.141 lm and the incident flux of the LGP is 0.102 lm.

For a third package type TYPE 3, the depth of the cavity is 300 μm, and the surface of the molding member has a flat shape. In the luminance distribution of the third package type TYPE 3, the total flux is 0.207 lm and the incident flux of the LGP is 0.170 lm.

For a fourth package type TYPE 4, the depth of the cavity is 300 μm and the surface of the molding member has a concave lens shape. In the luminance distribution of the fourth package type TYPE 4, the total flux is 0.182 lm and the incident flux of the LGP is 0.158 lm.

These package types are formed by changing the depth of the cavity and the surface of the molding member. Compared with the first and second package types TYPE 1 and TYPE 2, the third and fourth package types TYPE 3 and TYPE 4 have wider orientation characteristics of luminance distribution and the increased total flux and incident flux of the LGP.

FIG. 6 is a table showing a comparison result of total flux and incident flux of the LGP with respect to second inside angles θ7, θ8 and θ9 of a cavity, an area of a bottom surface of the cavity, an inside angle, and a surface shape of a molding member in the light emitting device according to the first embodiment. The experimental conditions of FIG. 6 are identical to those of FIG. 5.

For eleventh to thirteenth package types TYPE 11, TYPE 12 and TYPE 13, the surface of the molding member has a flat shape and the inside angles θ7, θ8 and θ9 of the cavity and the area of the bottom surface vary. For fourteenth to sixteenth package types TYPE 14, TYPE 15 and TYPE 16, the surface of the molding member has a concave lens shape and the inside angles θ7, θ8 and θ9 of the cavity and the area of the bottom surface vary. The cavities of the eleventh to sixteenth package types TYPE 11 to TYPE 16 have the same depth in the range from 250 μm to 450 μm.

For the eleventh and fourteenth package types TYPE 11 and TYPE 14, the inside angle θ7 is 25° and the area of the bottom surface of the cavity is 350 μm. For the twelfth and fifteenth package types TYPE 12 and TYPE 15, the inside angle θ8 is 28.5° and the area of the bottom surface of the cavity is 310 μm. For the thirteenth and sixteenth package types TYPE 13 and TYPE 16, the inside angle θ9 is 20.6° and the area of the bottom surface of the cavity is 380 μm. That is, the inside angle of the cavity is inversely proportional to the area of the bottom surface of the cavity.

The measured total flux in the eleventh to sixteenth package types TYPE 11 to TYPE 16 are respectively 0.233 lm, 0.211 lm, 0.199 lm, 0.212 lm, 0.188 lm, and 0.212 lm.

The measured incident flux of the LGP in the eleventh to sixteenth package types TYPE 11 to TYPE 16 are respectively 0.169 lm, 0.160 lm, 0.147 lm, 0.166 lm, 0.149 lm, and 0.166 lm.

The eleventh to sixteenth package types TYPE 11 to TYPE 16 have larger flux than the first and second package types TYPE 1 and TYPE 2. In addition, the eleventh package type TYPE 11 is larger than the other package types in terms of the total flux and the incident flux of the LGP. That is, when the cavities have the same depth, the total flux and the incident flux of the LGP vary depending on the inside angle of the cavity and the area of the bottom surface.

In the above-described light emitting devices, the intensity and flux of a lateral emission type LED can be increased by increasing the tilt angle of the sidewalls while minimizing the depth of the cavity.

Figure 7:
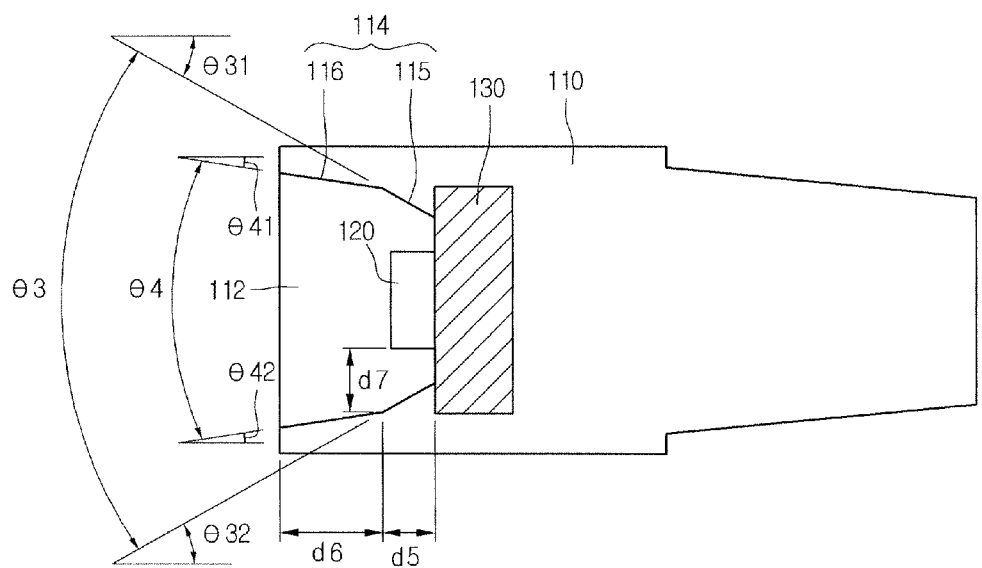
FIG. 7 is a longitudinal cross-sectional view of a light emitting device according to a second embodiment.

FIG. 7 is a longitudinal cross-sectional view of a light emitting device 101 according to a second embodiment.

Referring to FIG. 7, a package body 110 can be constructed in such a way that each sidewall 114 of the cavity 112 has two or more inclined surfaces. The sidewall 114 of the cavity 112 can include a lower sidewall 115 and an upper sidewall 116, where a third inside angle θ3 of the lower sidewall 115 is larger than a fourth inside angle θ4 of the upper sidewall 116. The total depth "d5+d6" of the cavity 112 is equal to or less than 450 μm, and the depth d6 of the upper sidewall 116 is larger than the depth d5 of the lower sidewall 115.

For example, the lower sidewall 115 of the cavity 112 can extend to a location of 70 μm to 250 μm from the bottom surface of the cavity 112, and the third inside angle θ3 can be 30° to 50°. The upper sidewall 116 can extend to the top of the cavity 112 by a depth d6 of 200 μm to 380 μm, and the fourth inside angle θ4 of the upper sidewall 116 can be about 0° to 20°. The angles θ31 and θ32 of both of the lower sidewalls 115 may be identical to or different from each other within the range of the third inside angle θ3 of the lower sidewall 115. Likewise, the angles θ41 and θ42 of both of the upper sidewalls 116 may be identical to or different from each other within the range of the fourth inside angle θ4 of the upper sidewall 116.

The lower sidewall 115 of the cavity 112 may be formed to the height at which the light emitted from a light emitting element 120 can be maximally reflected upward. For example, the height can be greater than the height (e.g., 70 μm to 130 μm) of the light emitting element 120. At this point, due to the angle θ3 of the lower sidewall 115, the distance d7 between the light emitting element 120 and the lower sidewall 115 becomes larger, thereby preventing the color of molding resin (i.e., the sidewall) from changing due to light or heat emitted from the light emitting element 120.

In addition, when compared with other cavities, the optical efficiency of the cavity 112 can be maximized by adjusting the tilt angle of the cavity 112 to the sidewall 114.

Figure 8:
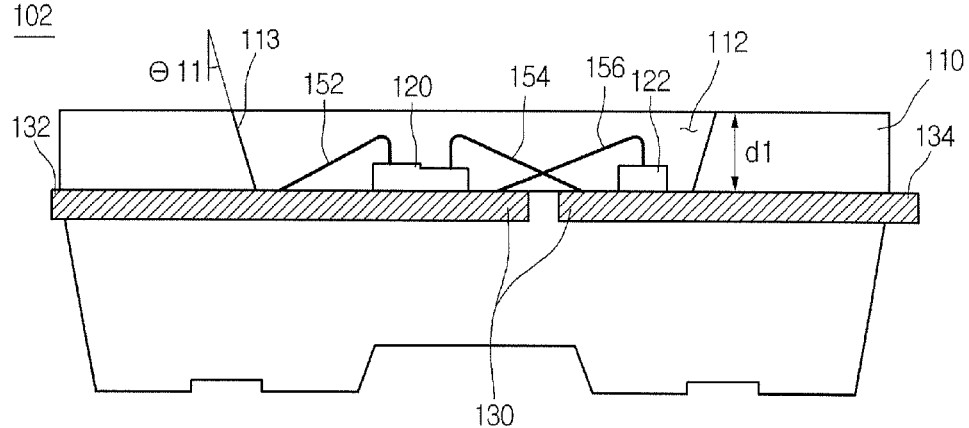
FIGS. 8 to 10 are cross-sectional views illustrating other examples of a light emitting device according to the first embodiment.
Figure 9:
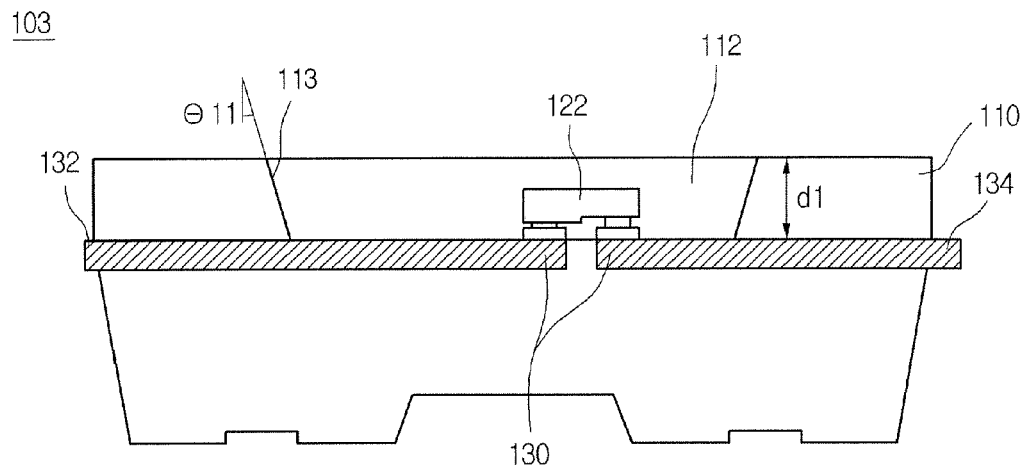
Figure 10:
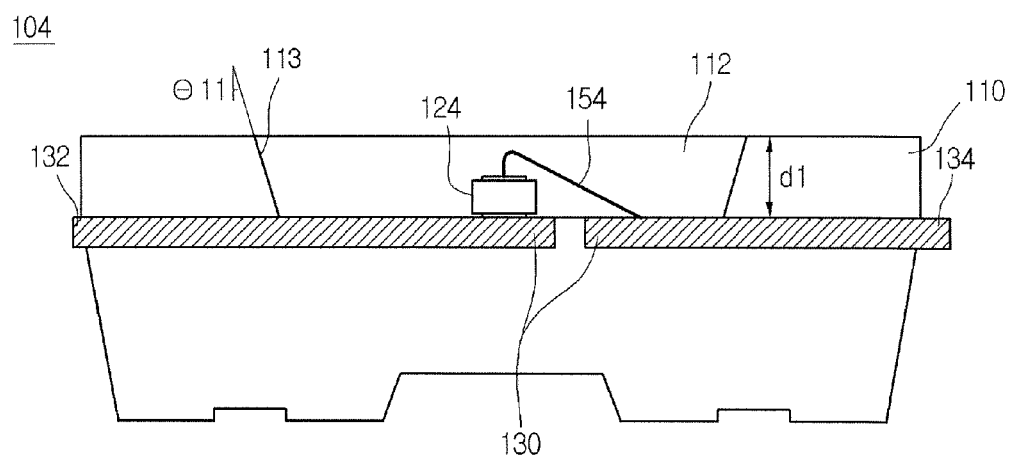

FIGS. 8 to 10 are cross-sectional views illustrating other examples of a light emitting device according to the first embodiment.

Referring to FIG. 8, a light emitting device 102 can be mounted with one or more light emitting elements 120 and one or more protection elements 122. The light emitting element 120 and the protection element 122 can be mounted on lead frames 130 in a cavity 112 of a package body 110 in a chip type. The light emitting element 120 can be attached to one lead frame 130 and connected by wires 152 and 154. The protection element 122 can be attached to another lead frame 130 and connected to the lead frame 130 where the light emitting element 120 is attached by a wire 156. Alternatively, semiconductor devices may be mounted in a flip-chip type in order to reduce the height of the wire in the cavity.

Referring to FIG. 9, a light emitting device 103 can be mounted with one or more light emitting elements 124 in a flip-chip type. To this end, both electrodes of the light emitting element 124 can be connected to two lead frames 130 using solder bumps.

Referring to FIG. 10, a light emitting device 104 can include one or more vertical-type light emitting elements 124. To this end, a first electrode of the vertical-type light emitting element 124 can be attached to one lead frame 130 by conductive adhesive, and a second electrode of the vertical-type light emitting element 124 can be connected to another lead frame 130 by a wire 154.

In addition, lead electrodes 132 and 134 of the two lead frames 130 can be formed outside the package body 110 of FIGS. 8 to 10.

Figure 11A:
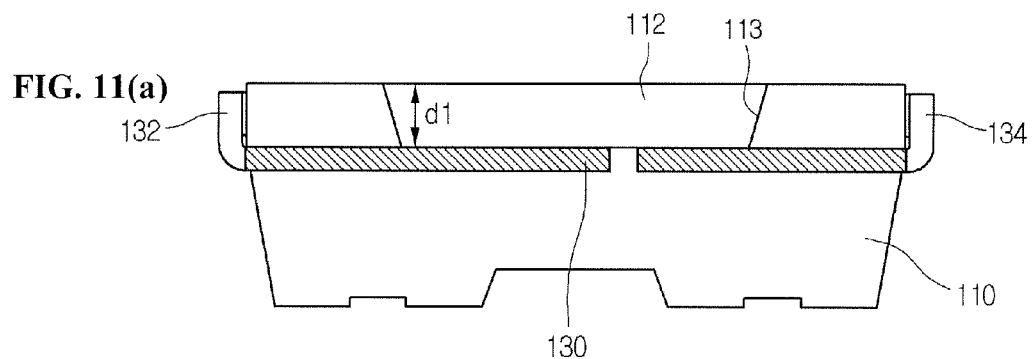
FIGS. 11(a)-11(c) are package structure views of an LED package according to the first embodiment.
Figure 11B:
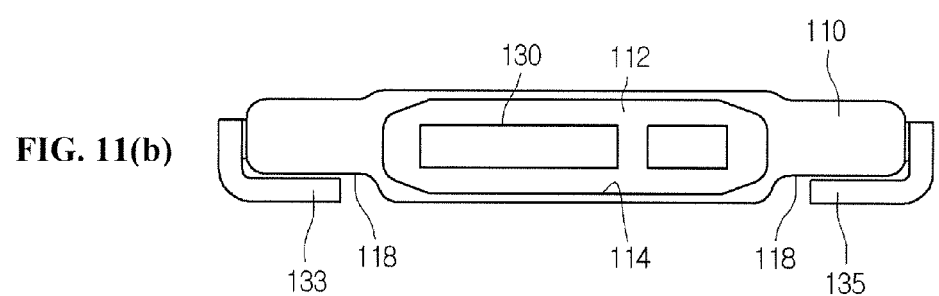
Figure 11C:
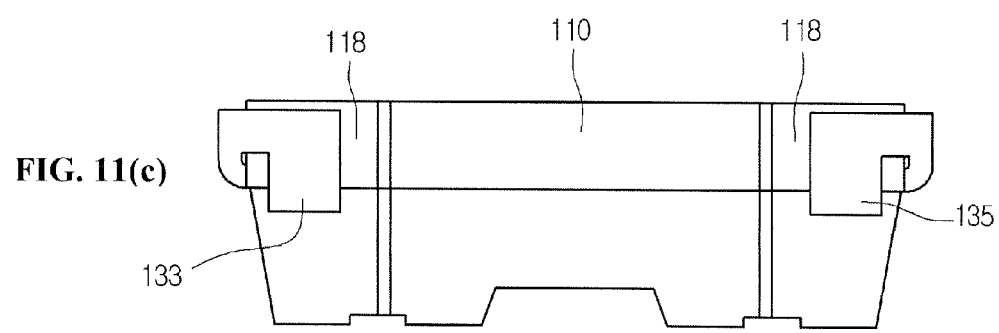

FIG. 11 illustrates a package structure of a light emitting device according to the first embodiment before a semiconductor device is mounted thereon. Specifically, FIG. 11(a) is a cross-sectional view of a package body, FIG. 11(b) is a top/front view of the package body, and FIG. 11(c) is a bottom view of the package body.

Referring to FIG. 11(a), a lead frame 130 located at the bottom of the cavity 112 of the package body 110 forms a base line for the height d1 and corresponds to the bottom surface of the cavity 112.

Referring to FIGS. 11(b) and 11(c), the first and second lead electrodes 132 and 134 of the lead frame 130 can be primarily formed at the outside of the package body 110 in a lateral direction, and can be formed in a groove 118 at both bottom sides of the package body 110. The both ends 133 and 135 of the first and second lead electrodes 132 and 134 can be disposed at the both bottom sides of the package body 110 and thus can be installed on a substrate by surface mount technology (SMT).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A side emission type light emitting device, comprising:
   a package body comprising a resin and a cavity which is provided with a bottom face and two pairs of opposite inner walls surrounding the bottom face, the package body including a front surface having an opening configured to be a top face of the cavity, a back surface disposed on an opposite side of the package body with respect to the front surface, and a bottom surface extending between the front surface and the back surface, the back surface including a recess recessed toward the front surface, the bottom surface including a stepped portion, the two pairs of opposite inner walls including a first inner wall, a second inner wall facing the first inner wall, a third inner wall, and a fourth inner wall facing the third inner wall;
   a lead frame including a mounting portion configured to form the bottom face of the cavity, and a flat portion extended from the mounting portion outside the package body, the flat portion disposed on the stepped portion of the bottom surface of the package body; and
   a light emitting element disposed on the mounting portion of the lead frame,
   wherein a distance from the front surface of the package body to the bottom face is less than 450 micro meters,
   wherein a bottom surface of the flat portion of the lead frame is positioned lower than the bottom surface of the package body,
   wherein a first angle between the first inner wall of the cavity and the second inner wall of the cavity is different from a second angle between the third inner wall of the cavity and the fourth inner wall of the cavity,
   wherein the first angle is greater than the second angle and no greater than 4.0 times the second angle, and
   wherein an angle of inclination of the third inner wall of the cavity with reference to an axis perpendicular to the bottom face of the cavity is different from an angle of inclination of the fourth inner wall of the cavity with reference to the axis perpendicular to the bottom face of the cavity.

2. The side emission type light emitting device according to claim 1, wherein the bottom surface of the package body includes a flat portion perpendicular to the bottom face of the cavity, and a slanted portion inclined from the flat portion.

3. The side emission type light emitting device according to claim 1, wherein the package body includes a side surface extending between the front surface and the back surface on a lateral side of the package body, which is perpendicular to all of the front surface, the back surface, and the bottom surface.

4. The side emission type light emitting device according to claim 3, wherein the side surface includes a flat portion perpendicular to the bottom surface of the cavity, and a slanted portion inclined from the flat portion.

5. The side emission type light emitting device according to claim 2, wherein at least one of the bottom surface of the package body and the side surface of the package body includes a flat portion perpendicular to the front surface of the package body, and a slanted portion inclined from the flat portion.

6. The side emission type light emitting device according to claim 1, wherein the recess of the back surface of the package body includes two pairs of opposite inner walls.

7. The side emission type light emitting device according to claim 6, wherein a longest distance between opposing inner walls of the two pairs of opposite inner walls of the cavity is larger than a longest distance between opposing inner walls of the two pairs of opposite inner walls of the recess of the back surface of the package body.

8. The side emission type light emitting device according to claim 7, wherein a depth from the front surface of the package body to the bottom face of the cavity of the package body is larger than a depth of the recess of the back surface of the package body.

9. The side emission type light emitting device according to claim 8, wherein a center of the cavity of the package body is aligned with a center of the recess of the back surface of the package body.

10. The side emission type light emitting device according to claim 5, wherein the stepped portion of the bottom surface of the package body is beyond the cavity of the package body.

11. The side emission type light emitting device according to claim 9, wherein the stepped portion of the bottom surface of the package body is beyond the cavity of the package body.

12. The side emission type light emitting device according to claim 1, wherein an angle of inclination of the first inner wall of the cavity is different from an angle of inclination of the second inner wall of the cavity.

13. The side emission type light emitting device according to claim 5, wherein an angle of inclination of the first inner wall of the cavity is different from an angle of inclination of the second inner wall of the cavity.

14. The side emission type light emitting device according to claim 9, wherein an angle of inclination of the first inner wall of the cavity is different from an angle of inclination of the second inner wall of the cavity.

15. The side emission type light emitting device according to claim 1, wherein the first angle is in a range from 20 degrees to 80 degrees, and
wherein the second angle is in a range from 20 degrees to 40 degrees.

16. The side emission type light emitting device according to claim 5, wherein the first angle is in a range from 20 degrees to 80 degrees, and
wherein the second angle is in a range from 20 degrees to 40 degrees.

17. The side emission type light emitting device according to claim 9, wherein the first angle is in a range from 20 degrees to 80 degrees, and
wherein the second angle is in a range from 20 degrees to 40 degrees.

18. The side emission type light emitting device according to claim 15, wherein a ratio of a distance from the front surface of the package body to the bottom face of the cavity to a distance between the third inner wall of the cavity and the fourth inner wall of the cavity at the bottom face of the cavity is from 0.65 to 1.45.

19. The side emission type light emitting device according to claim 16, wherein a ratio of a distance from the front surface of the package body to the bottom face of the cavity to a distance between the third inner wall of the cavity and the fourth inner wall of the cavity at the bottom face of the cavity is from 0.65 to 1.45.

20. The side emission type light emitting device according to claim 17, wherein a ratio of a distance from the front surface of the package body to the bottom face of the cavity to a distance between the third inner wall of the cavity and the fourth inner wall of the cavity at the bottom face of the cavity is from 0.65 to 1.45.

21. A side emission type light emitting device, comprising:
a package body comprising a resin and a cavity which is provided with a bottom face and two pairs of opposite inner walls surrounding the bottom face, the package body including a front surface having an opening configured to be a top face of the cavity, a back surface disposed on an opposite side of the package body with respect to the front surface, and a bottom surface extending between the front surface and the back surface, the back surface including a recess recessed toward the front surface, the bottom surface including a stepped portion, the two pairs of opposite inner walls including a first inner wall, a second inner wall facing the first inner wall, a third inner wall, and a fourth inner wall facing the third inner wall;
a lead frame including a mounting portion configured to form the bottom face of the cavity, and a flat portion extended from the mounting portion outside the package body, the flat portion disposed on the stepped portion of the bottom surface of the package body; and
a light emitting element disposed on the mounting portion of the lead frame,
wherein a distance from the front surface of the package body to the bottom face is less than 450 micro meters,
wherein a bottom surface of the flat portion of the lead frame is positioned lower than the bottom surface of the package body,
wherein a first angle between the first inner wall of the cavity and the second inner wall of the cavity is different from a second angle between the third inner wall of the cavity and the fourth inner wall of the cavity,
wherein the first angle is greater than the second angle and no greater than 4.0 times the second angle, and
wherein a ratio of a distance from the front surface of the package body to the bottom face of the cavity to a distance between the third inner wall of the cavity and the fourth inner wall of the cavity at the bottom face of the cavity is from 0.65 to 1.45, and
wherein the first angle is in a range from 20 degrees to 80 degrees and the second angle is in a range from 20 degrees to 40 degrees.

22. The side emission type light emitting device according to claim 21, wherein an angle of inclination of the first inner wall of the cavity is different from an angle of inclination of the second inner wall of the cavity.

* * * * *